(12) United States Patent
Khan et al.

(10) Patent No.: US 6,979,652 B2
(45) Date of Patent: Dec. 27, 2005

(54) ETCHING MULTI-SHAPED OPENINGS IN SILICON

(75) Inventors: Anisul Khan, Santa Clara, CA (US); Sharma V Pamarthy, Hayward, CA (US); Sanjay Thekdi, Santa Clara, CA (US); Ajay Kumar, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 90 days.

(21) Appl. No.: 10/118,763

(22) Filed: Apr. 8, 2002

(65) Prior Publication Data

US 2003/0189024 A1 Oct. 9, 2003

(51) Int. Cl.$^7$ ............... H01L 21/302; H01L 21/3065
(52) U.S. Cl. ............... 438/700; 438/703; 438/706; 438/710
(58) Field of Search ............... 438/700, 703, 438/706, 710, 712

(56) References Cited

U.S. PATENT DOCUMENTS

| | | | | |
|---|---|---|---|---|
| 5,501,893 A | * | 3/1996 | Laermer et al. | 428/161 |
| 5,629,226 A | * | 5/1997 | Ohtsuki | 438/389 |
| 5,888,887 A | * | 3/1999 | Li et al. | 438/525 |
| 6,051,503 A | * | 4/2000 | Bhardwaj et al. | 438/705 |
| 6,110,395 A | * | 8/2000 | Gibson, Jr. | 216/67 |
| 6,187,685 B1 | * | 2/2001 | Hopkins et al. | 438/710 |
| 2002/0148807 A1 | * | 10/2002 | Zhao et al. | 216/2 |

* cited by examiner

*Primary Examiner*—Nadine G. Norton
*Assistant Examiner*—Lynette T. Umez-Eronini
(74) *Attorney, Agent, or Firm*—Moser, Patterson & Sheridan LLP; Joseph Bach

(57) ABSTRACT

Openings of variable shape are made sequentially by alternately etching an opening in silicon and depositing a conformal fluorocarbon polymer on the sidewalls. This polymer protects the sidewalls of the opening from further etching. An isotropic etch can be carried out to change the profile of the etched feature, and for lift-off of the etched feature from the silicon substrate.

28 Claims, 4 Drawing Sheets

ETCHING MULTI-SHAPED OPENINGS IN SILICON

This invention relates to a method of forming devices having varying profiles in situ in a single chamber. More particularly, this invention relates to a method of alternately etching openings in a silicon substrate and depositing a protective polymer coating on the sidewall openings to protect the silicon features from attack during a subsequent silicon etch step.

BACKGROUND OF THE INVENTION

Micro-machining and micro-electromechanics (MEMS) technologies have been advancing steadily. These technologies use semiconductor processing techniques to form electrical and mechanical structures in a substrate, particularly in silicon. By using known silicon etch techniques, devices having varying profiles can be formed in a silicon-containing substrate, and then released, as by overetching, to remove the devices from the underlying silicon or silicon oxide. As examples, an anisotropic etch can be carried out to form an opening with straight, parallel sidewalls; or with straight tapered sidewalls, tapered outwardly or inwardly; or an isotropic etch can be carried out which changes the geometry or which can lift up and separate the feature from the substrate. When very small features are to be made, the etch processes must be carefully controlled, particularly for re-entrant profiles.

Further, the sidewalls of the etched openings must be protected from further etching if the shape of the opening is to be changed sequentially, as, when an anisotropic etch is to be followed with an isotropic etch.

It would be highly desirable to be able to carry out different sequential etch steps in situ, in a single reaction chamber, that changes the profile of the formed features while protecting the already etched openings from additional etching.

SUMMARY OF THE INVENTION

We have found that after etching an opening, or part of an opening, in a silicon substrate, the sidewalls can be protected with a fluorocarbon-type polymer. The protective polymer layer is deposited in a highly conformal manner, forming a thick, etch impervious polymer layer that is able to protect the already-formed opening sidewalls. Manipulation of bias power during polymer deposition can prevent polymer deposition on the bottom of an opening during sequential etch steps. Further, the conformal polymer layer must be able to be removed readily, as with a dry or wet etch step.

The fluorocarbon forms and deposits a polytetrafluoroethylene-type polymer coating that is non-porous and conformal, and that is thick enough to protect the etched sidewalls from further etching.

In order to form high aspect ratio openings, the etch and deposition steps are alternated in a controlled manner so that the lengthening sidewalls are protected from further etching with a protective, conformal polymer coating just after the sidewalls are formed.

Another use of this technique is to change the etchant from an anisotropic one, that etches straight walled openings, whether parallel or tapered, to an isotropic etchant. The isotropic etchant can change the shape or geometry of the etched feature, as to a vase-like or nozzle-shaped opening, or to provide release of a feature from the substrate for MEMS processing.

Multi-shaped cavities can be made using a time multiplexed, gas modulation technique. When the etch rate of a particular etchant and a polymer deposition rate is determined, the etch and deposition steps can be alternated at a predetermined but changeable rate to provide irregular shapes and final release from the substrate.

We have found that when t2 (deposition rate) over t1 (etch rate) is less than 0.7, i.e., $$\frac{t1}{t2}, < 0.7$$

openings with a positive taper are obtained. To obtain a negatively tapered opening, t1 should be greater than t2, i.e., $$\frac{t1}{t2}, > 0.7$$

To obtain vertical openings having parallel sidewalls, t1 and t2 are related as $$\frac{t2}{t1} = \frac{7}{10}.$$

By combining time multiplexed loops of alternating etch and deposition steps, many different shapes can be made controllably in situ in a single etch chamber.

DETAILED DESCRIPTION OF THE INVENTION

The present etch/deposition process can be used to etch conductors, such as single crystal silicon, epitaxial silicon, polysilicon, silicon-on-insulator and metal gate or other conductor materials. The present method can be used to form deep or shallow trenches, gate structures, patterning of conductor/oxide/silicon and the like to form semiconductor devices including pressure sensors, accelerometers, micro-mirrors, optical switches, medical and other microstructures such as micro-nozzles and the like.

Figure 1:
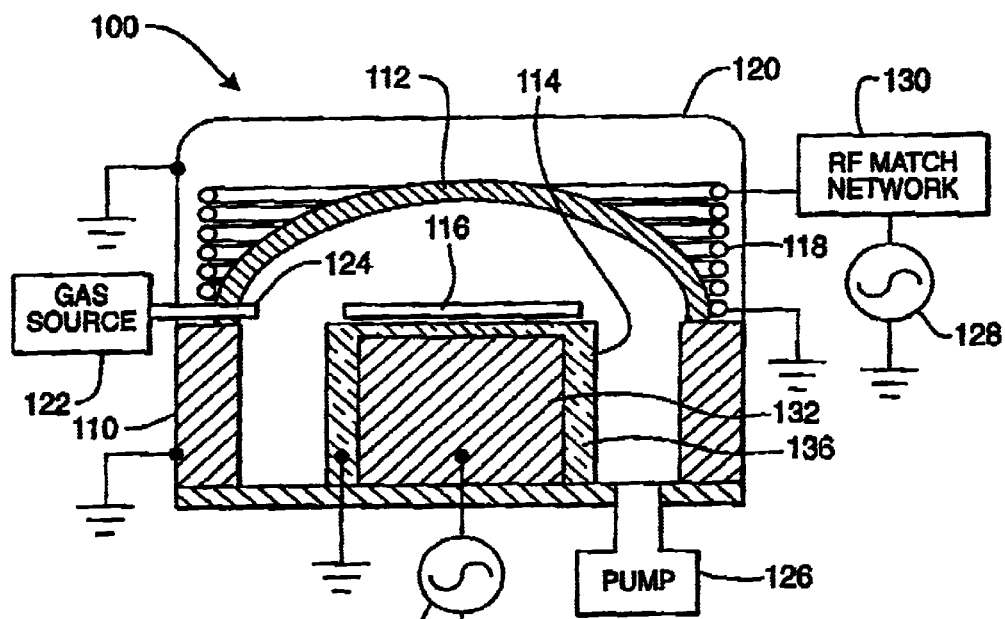
FIG. 1 is a cross sectional view of a chamber suitable for carrying out the present etch/deposition process in situ.

The present alternating etch/deposition process can be carried out in a decoupled plasma source (DPS) chamber as shown in FIG. 1.

Referring to FIG. 1, an inductively coupled RF plasma reactor includes a reactor chamber 100 having a grounded conductive cylindrical sidewall 110 and a shaped, dielectric ceiling 112, e.g., dome-like. The reactor includes a substrate support electrode 114 for supporting a substrate 116 to be processed in the chamber 100; a cylindrical inductor coil 118 surrounding an upper portion of the chamber beginning near the plane of the top of the substrate 116, or substrate support electrode 114, and extending upwardly therefrom toward the top of the chamber 100; process gas sources 122 and a gas inlet 124 which can be a plurality of inlets spaced about the interior of the chamber; and a pump 126 for controlling the chamber pressure. The coil inductor 118 is energized by a plasma source power supply, or RF generator 128, through a conventional active RF match network 130, the top winding of the inductor coil 118 being "hot" and the bottom winding being grounded. The substrate support electrode 114 includes an interior conductive portion 132 connected to a bias RF power supply or generator 134, and an exterior grounded conductor 136 which is insulated from the interior conductive portion 132. A conductive grounded RF shield 120 surrounds the coil inductor 118.

In accordance with one aspect of the chamber 100, uniformity of the plasma density spatial distribution across the substrate is improved by shaping the ceiling 112 as a multi-radial dome and individually determining or adjusting each one of the multiple radii of the ceiling 112. The multiple-radius dome shape in the embodiment of FIG. 1 somewhat flattens the curvature of the dome ceiling 112 about the center portion of the dome, the peripheral portion of the dome having a steeper curvature.

To carry out the present process, during the deposition step, the source power is turned on and a fluorocarbon or hydrofluorocarbon processing gas is passed into the chamber 100 from the desired gas containers (not shown). The power to the chamber 100 from the inductive RF power source 128 is suitably from about 200 up to about 3000 watts, and is preferably from about 400 to 2000 watts. The RF source can be a 12.56 MHz power source. No bias power is used during the deposition step. The pressure during this step is maintained suitably at from about 5–300 millitorr, preferably about 40 millitorr. The addition of hydrogen bromide (HBr) in an amount of about 5–25% by volume to the fluorocarbon improves the conformality of the polymer deposit.

Suitable fluorocarbon gases include polymer-generating gases such as dihydrodifluoromethane ($CH_2F_2$), $C_4F_6$, $C_4F_8$ and the like. Such gases form a polytetrafluoroethylene-like, etch-resistant coating on the feature sidewalls, protecting them during a subsequent etching step. The deposition step is generally carried out for about 1 to 10 seconds. Suitably the deposition step is carried out for about 5 seconds at 18 millitorr pressure using about 700 watts of power and a gas flow of about 140 sccm.

During the etch step, silicon, or a silicon-containing substrate, is etched using a high gas flow of a fluorine-containing etch gas, such as sulfur hexafluoride, nitrogen trifluoride or carbon tetrafluoride, at a pressure of between about 77 millitorr up to about 100 Torr, and suitably at about 250 millitorr. The gas flow rate in the chamber of FIG. 1 is about 250 sccm, but other etch chambers may permit higher gas flow rates. During etching, a high source power of over 500 watts is used.

At a pressure of 7 millitorr up to 100 Torr, using a source power of about 500 to 1500 watts, an etch rate of up to about 6 microns per minute can be obtained using the above chamber. Still higher etch rates can be achieved using a higher source power, depending on the chamber used for etching. A bias source power to the substrate support electrode is also turned on, conveniently at a low power of from 34 to about 1000 watts. The chamber of FIG. 1 is limited to a bias power of about 3 to 500 watts, but different etch chambers may permit higher bias power to be used.

A frequency of about 400 kHz can be generated in the present chamber, but other frequencies can be used.

By varying the timing of sequential deposition and etch steps, an opening in silicon can have perpendicular sidewalls, resulting in an anisotropic opening, or the sidewalls can be tapered, positively or negatively, by varying the timing of the deposition and etch steps. As examples, when a negatively tapered opening in silicon is to be made, deposition is carried out for 5 seconds, and etch is carried out for 10–20 seconds; thus the etch time is longer than the deposition time. For a positive taper, deposition of polymer is carried out for 5 seconds and etch is carried out for 5 seconds; thus the deposition time and etch time is about the same. Straight, perpendicular sidewalls are obtained when deposition is carried out for 5 seconds and etch carried out for 10 seconds; thus the etch time is about double the deposition time.

The substrate can be cooled during etch processing, generally by means of a coolant passed to a channel in the substrate support electrode 114 in known manner. A coolant gas such as helium can also be passed between the substrate 116 and the substrate support 114 to enhance cooling and maintain the temperature of the substrate within a desired range, generally from about 10 to 100° C.

To further protect the sidewalls of etched patterns, tetrafluorosilane can also be added to the fluorocarbon deposition gas, generally at a flow rate of from about 20 to 300 sccm.

Inert gases such as argon and nitrogen, as well as oxygen, can also be added to one or both of the etch and deposition gases if desired.

The above alternating deposition/etch process has a high selectivity of up to 200 to either a photoresist or a silicon oxide or hard mask.

A time multiplexed gas modulation method has been developed so that multi-shaped cavities can be formed in silicon, particularly for MEMS/MST applications.

Depending on the etchant gas used, and the time of etch and deposition, one can obtain openings having straight walls and vertical or tapered sidewalls, or re-entrant profiles or openings that are isotropic. A known isotropic etch is HBr and helium-oxygen, and optionally sulfur hexafluoride. A good isotropic etchant includes HBr to which 5–10 sccm of helium containing about 30% of oxygen and 5–10 sccm of $SF_6$ is added.

FIG. 2 illustrates a conformal polymer coating on the vertical, parallel sidewalls of a trench made in accordance with the present alternating two-step etch/deposition method. The trenches were formed using $SF_6$ as an etchant and $C_4F_8$ as a polymer deposition gas.

Figure 2A:
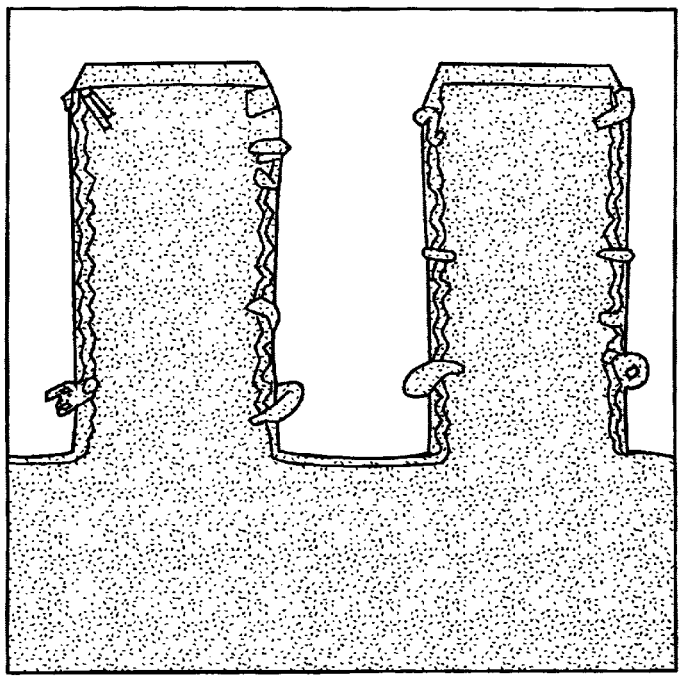
FIG. 2A illustrates deposition of a smooth conformal polymer coating on trench sidewalls and on the bottom of the trench.

FIG. 2A illustrates a smooth, conformal polymer deposition on the sidewalls and on the bottom of a trench.

Figure 2B:
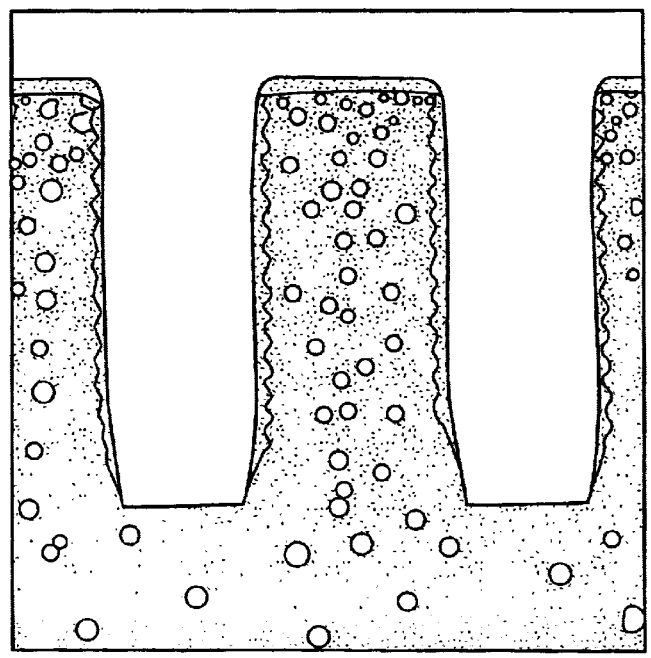
FIG. 2B illustrates deposition of a smooth conformal polymer coating on trench sidewalls only.

FIG. 2B illustrates a smooth, conformal polymer deposition only on the sidewalls of a trench. By preventing polymer deposition on the bottom of the trench, as by applying bias power to the substrate support during deposition, the sidewalls are protected but the trench can be deepened, or an isotropic etch can be used for lift-off purposes.

FIGS. 3A, 3B, 3C and 3D illustrate a four step method for forming a micro-nozzle etched in silicon using the above multi-step process.

Figure 3A:
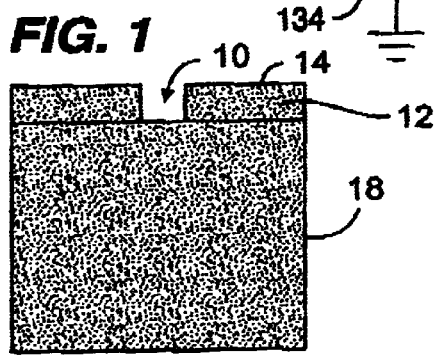
FIGS. 3A, 3B, 3C and 3D illustrate a four step process for forming a micronozzle in silicon.

FIG. 3A illustrates a straight walled opening 10 made in a photoresist layer 12, and a protective conformal polymer layer 14 deposited thereover, which greatly improves the selectivity between the photoresist and the underlying silicon substrate.

Figure 3B:
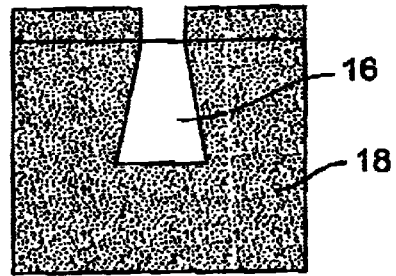
Figure 3C:
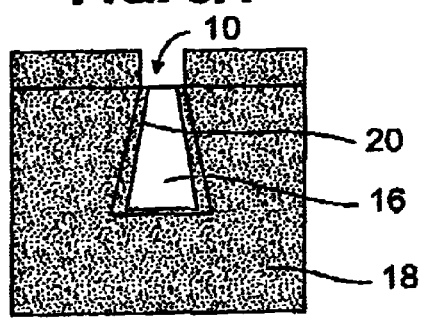
Figure 3D:
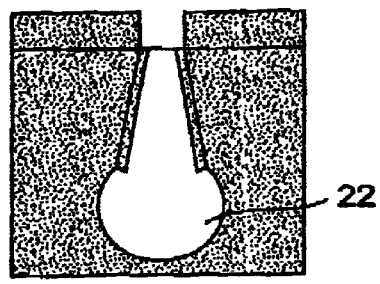

As shown in FIG. 3B, a tapered re-entrant opening 16 is then made in the silicon substrate 18 using a suitable deposition/etch ratio, as explained hereinabove. A polymer layer 20 is then deposited in the tapered opening 18, as shown in FIG. 3C. The effect of the polymer deposition is to make the diameter of the opening 16 somewhat narrower than the mask opening 10. An isotropic etchant, such as $SF_6$, is then used to isotropically etch a bowl-shaped opening 22 as the reservoir of the micro-nozzle. The final shape of the nozzle is shown in FIG. 3D.

Figure 4A:
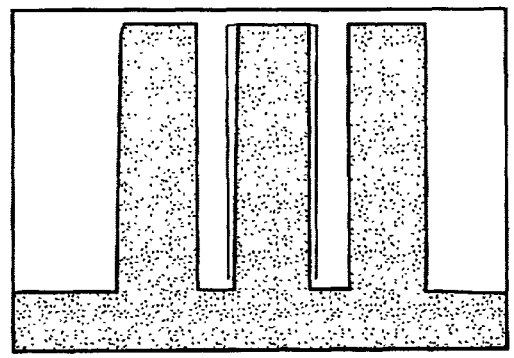
FIGS. 4A, 4B and 4C illustrate the steps needed to form very high aspect ratio openings in a silicon-on-insulator substrate.
Figure 4B:
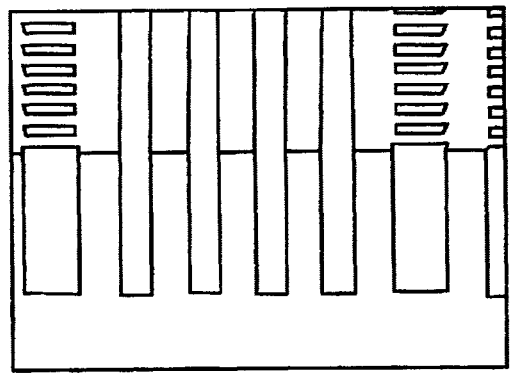
Figure 4C:
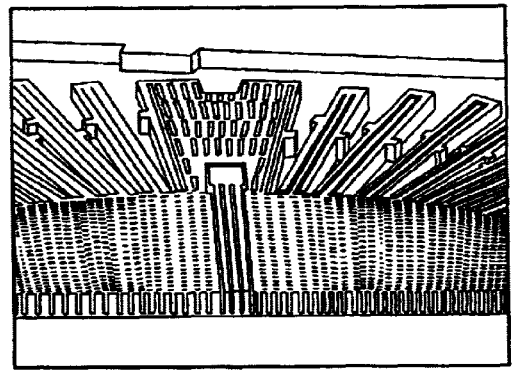

FIG. 4A illustrates a pattern of very high aspect ratio vertical trenches 16 microns in diameter etched in the polysilicon of an SOI substrate. Very high aspect ratio, straight walled openings are made down to the insulator, by changing the etch/deposition gases alternately until the underlying substrate is reached. It can be seen that no notching or lateral etch occurs at the silicon-oxide interface. No silicon residues remain at the bottom of the trench, as shown in FIG. 4B, with only a very slight loss, if any, of bottom oxide. Very complex patterns can be obtained, as shown in FIG. 4C.

Figure 5A:
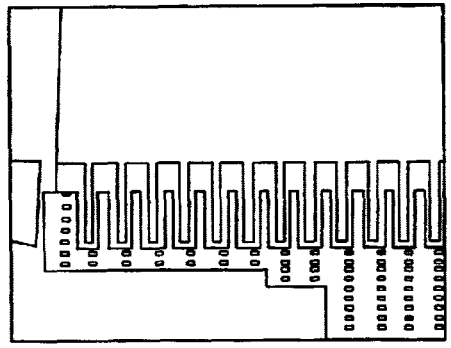
FIGS. 5A and 5B illustrate stages in the manufacture of a micro-sensor.

FIG. 5A illustrates stages in the manufacture of microsensors. Seven micron diameter trenches were etched in polysilicon using the present two-step etch/deposition method. Very fine features are obtained.

Figure 5B:
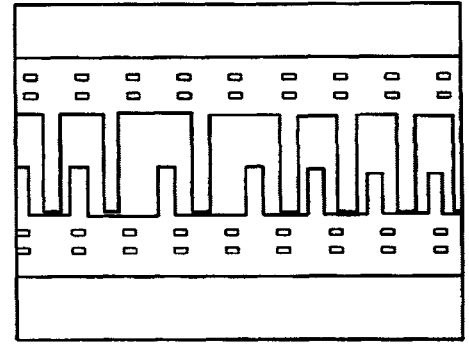

FIG. 5B illustrates lift-off of some of the features. This is due to too much etching of a negative taper, thus lifting off some of the features. This shows why very precise control of the deposition-etch steps is needed, particularly when etching very small features.

The polymer deposit can be deposited on the sidewalls only, but avoiding a polymer deposit on the bottom of the trench, as can be done by manipulating the bias power during the deposition step. The sidewalls are still protected, but the unprotected bottom is able to be further etched. An isotropic etch can be used to etch features laterally, forming various shapes. An anisotropic etch can be used to further deepen the trench.

Figure 6A:
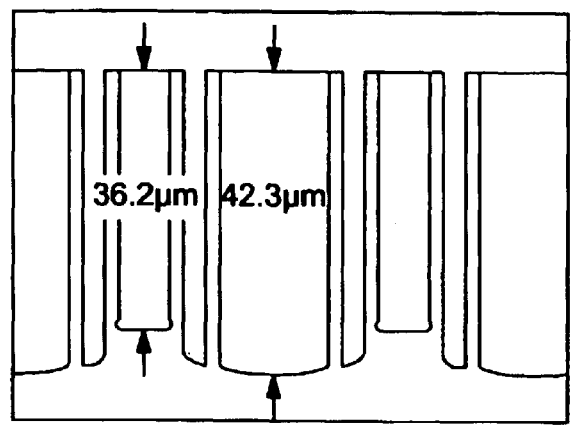
FIGS. 6A and 6B illustrate the excellent profile control obtainable using the method of the invention.
Figure 6B:
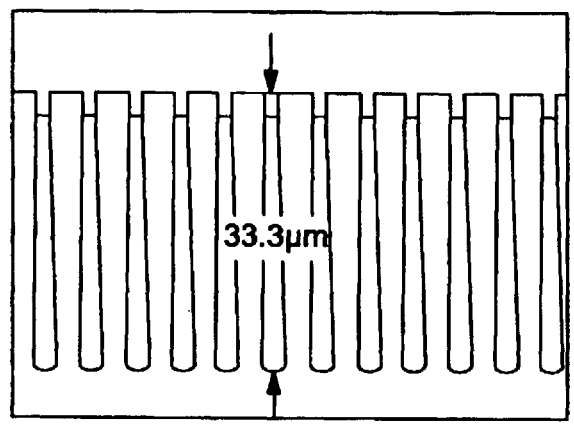

FIGS. 6A and 6B illustrate straight walled openings having vertical openings and parallel sidewalls, as shown in FIG. 6A, and openings having a re-entrant profile, with non-parallel sidewalls, as shown in FIG. 6B. This shows the excellent profile control obtainable with the present process.

Figure 7:
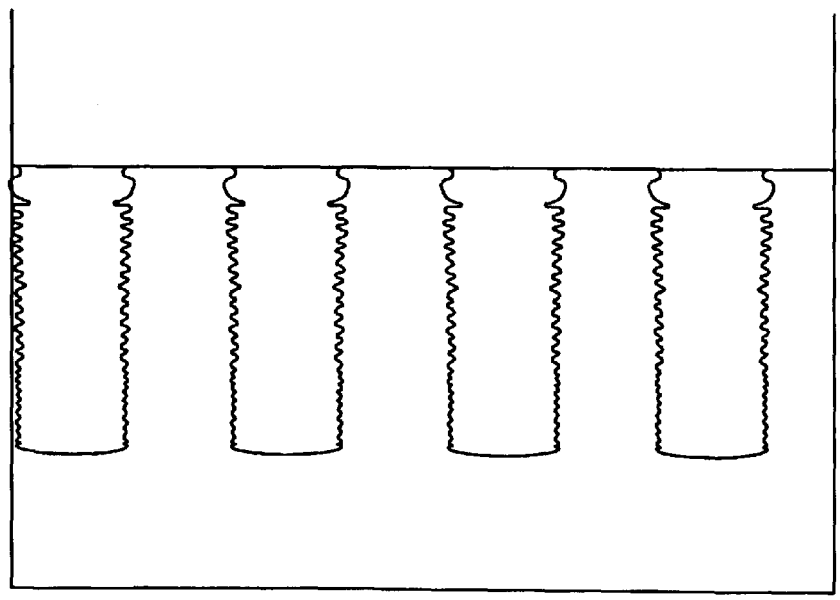
FIG. 7 illustrates an opening made in silicon having saw-toothed shaped sidewalls.

FIG. 7 illustrates a sawtoothed-type opening made using alternate deposition and etch steps. Polymer is deposited to protect the etched sidewalls, and an etch sequence is begun that removes the polymer from the bottom of the opening and etches isotropically. Polymer is then deposited and the deposition-etch cycle repeated. This deposition-etch sequence is continued until the desired depth of the opening is obtained. The openings shown are 5 microns in diameter and have a depth of 14.5 microns. The etch rate was 1.79 microns/min and the selectivity to the photoresist was 37.8.

Openings can be made by etching anisotropically for a time period, depositing a polymer thereover, then a different etch-deposition sequence can be used to produce a different shape, as to produce a re-entrant profile and the like. By proper choice of deposition time and etch time, varied, complex and highly controlled shapes can be made in silicon.

The thick polymer coating holds all the elements together until it is removed, another advantage of the present etch and deposition method.

Although the present invention is described in terms of specific embodiments, one skilled in the art will know that other embodiments of etchant gases, deposition gases, substrates and processing chamber can be substituted. The invention is only meant to be limited by the scope of the appended claims.

We claim:

1. A method of forming variable shaped features in a silicon substrate comprising:
   etching an opening having a first sidewalls section in a silicon substrate at a first etch rate;
   depositing a fluorocarbon polymer conformally on the first sidewalls section of the opening at a first deposition rate using a polymer forming gas so as to protect the first sidewalls section from further etching;
   performing a second silicon etching step at a second etch rate to expose a second sidewalls section below the first sidewalls section;
   depositing a fluorocarbon polymer conformally on the second sidewalls section of the opening at a second deposition rate using a polymer forming gas so as to protect the second sidewalls; and
   performing a third silicon etching step at a third etch rate to expose a third sidewalls section below the second sidewalls section, wherein the first, second and third sidewalls sections have different profiles.

2. The method according to claim 1 wherein different polymer forming gas is used to produce openings having different sidewalls shapes.

3. The method according to claim 1 wherein one of the etching steps is an isotropic etch process and releases etched features.

4. The method according to claim 1 wherein the polymer forming gas used to protect the first sidewalls section comprises at least one of C4F4, CH2F26 and C4F8.

5. The method according to claim 1 wherein a ratio of the second deposition rate to the second etch rate is less than 0.7.

6. The method according to claim 1 wherein a ratio of the second deposition rate to the second etch is greater than 0.7.

7. The method according to claim 1 wherein to form the opening having straight, parallel sidewalls a ratio of the first deposition rate to the first etch is equal to 0.7.

8. The method according to claim 1 further comprising applying bias power during the deposition step to prevent polymer deposition on the bottom of the opening.

9. The method according to claim 1 comprising performing deposition and etch steps for time periods that determine the shape of an opening.

10. The method according to claim 1 wherein the polymer forming gas further comprises HBr.

11. A method of forming variable shaped features in a silicon substrate comprising:
    etching an opening having sidewails in a silicon substrate at an etch rate;
    depositing a polymer on the sidewalls of the opening at a deposition rate, the etching and deposition steps defining a cycle having a sidewall etch rate; and
    sequentially repeating the cycle at least three times, wherein at least one of the etch or deposition rate is different in at least two cycles, wherein the sidewall etch rates are different between at least two cycles.

12. The method of claim 11, wherein a different polymer forming gas is used in the least two of the cycles.

13. The method according to claim 11, wherein a polymer forming gas used in the deposition step comprises at least one of C4F4, CH2F2, and C4F8.

14. The method according to claim 11, wherein a ratio of the deposition rate to the etch rate in at least one of the cycles is less than 0.7.

15. The method according to claim 11, wherein a ratio of the deposition rate to the etch rate is greater than 0.7 in a first cycle and less than 0.7 in a second cycle.

16. The method according to claim 11, wherein at least a first cycle has a ratio of the deposition rate to the etch rate greater than 0.7, at least a second cycle has a ratio of the deposition rate to the etch rate less than 0.7; and at least one cycle has a ratio of the deposition rate to the etch rate equal to about 0.7.

17. The method according to claim 11 further comprising:
applying bias power during the deposition step to prevent polymer deposition on the bottom of the opening.

18. The method according to claim 11, wherein the polymer forming gas further comprises HBr.

19. A method of forming variable shaped features in a silicon substrate comprising:
etching an opening having first sidewalls portion in a silicon substrate at an etch rate;
depositing a polymer on the first sidewalls portion of the opening at a deposition rate, the etching and deposition steps defining a first process cycle;
performing a second process cycle to etch a second sidewalls portion the silicon substrate below the first sidewalls portion of the opening, the second process cycle having a ratio of etch rate to deposition rate different than the first process cycle, wherein silicon sidewall etch rates of the first cycle is slower than the second cycle; and
performing a third process cycle to etch a third sidewalls portion the silicon substrate below the second sidewalls portion of the opening, the first, second and third sidewall portions having different profiles.

20. The method of claim 19, wherein a different polymer forming gas is used in each of the first and second cycles.

21. The method according to claim 19, wherein a polymer forming gas uses in at least one of the cycles further comprises at least one of C4F4, CH2F2, and 04F8.

22. The method according to claim 19, wherein a ratio of the deposition rate to the etch rate in at least one of the cycles is less than 0.7.

23. The method according to claim 19, wherein at least one of the first and second cycles has a ratio of the deposition rate to the etch rate is greater than 0.7 and at least one of the first and second cycles has a ratio of the deposition rate to the etch rate less than 0.7.

24. The method according to claim 19 further comprising: a third cycle having a ratio of the deposition rate to the etch rate equal to about 0.7.

25. The method according to claim 19 further comprising: applying bias power during the deposition step to prevent polymer deposition on the bottom of the opening.

26. The method according to claim 19 wherein a polymer forming gas used during at least one of the deposition steps further comprises HBr.

27. The method according to claim 19, wherein the second cycle does not etch the first sidewalls portion.

28. The method according to claim 19, wherein the third cycle does not etch the second sidewalls portion.

* * * * *

UNITED STATES PATENT AND TRADEMARK OFFICE
CERTIFICATE OF CORRECTION

PATENT NO.    : 6,979,652 B1
DATED         : December 27, 2005
INVENTOR(S)   : Khan et al.

It is certified that error appears in the above-identified patent and that said Letters Patent is hereby corrected as shown below:

<u>Column 6,</u>
Line 36, delete "CH2F26" and insert -- $CH_2F_2$, --.
Line 54, delete "sidewails" and insert -- sidewalls --.
Line 64, after "in" delete "the" and insert -- at --.

<u>Column 8,</u>
Line 9, delete "04F8" and insert -- $C_4F_8$ --.

Signed and Sealed this

Sixth Day of June, 2006

JON W. DUDAS
*Director of the United States Patent and Trademark Office*